United States Patent [19]

Campbell

[11] Patent Number: 4,729,962
[45] Date of Patent: Mar. 8, 1988

[54] SEMICONDUCTOR JUNCTION FORMATION BY DIRECTED HEAT

[75] Inventor: Robert B. Campbell, Pittsburgh, Pa.

[73] Assignee: The United States of America as represented by the United States Department of Energy, Washington, D.C.

[21] Appl. No.: 843,486

[22] Filed: Mar. 24, 1986

[51] Int. Cl.⁴ .......................................... H01L 21/265
[52] U.S. Cl. .................................. 437/2; 148/DIG. 4; 148/DIG. 93; 437/16; 437/173; 437/942
[58] Field of Search ........................ 148/1.5, 175, 187; 29/576 B, 576 T, 572; 427/53.1

[56] References Cited

U.S. PATENT DOCUMENTS

| | | | |
|---|---|---|---|
| 3,940,289 | 2/1976 | Marquardt | 148/1.5 |
| 4,273,950 | 6/1981 | Chitre | 148/1.5 |
| 4,443,493 | 4/1984 | Delfino | 427/53.1 |
| 4,482,393 | 11/1984 | Nishiyama et al. | 148/1.5 |
| 4,514,440 | 4/1985 | Justice et al. | 29/572 |
| 4,539,431 | 9/1985 | Moddel et al. | 29/572 |
| 4,619,036 | 10/1986 | Havemann et al. | 148/1.5 |
| 4,621,411 | 11/1986 | Havemann et al. | 29/571 |

FOREIGN PATENT DOCUMENTS 48402  2/1984  Japan ............................... 29/576 T

OTHER PUBLICATIONS

USAMI et al., 18th Photovoltiaic . . . Conf., Las Vegas, Nevada, Oct. 1985.
Kato et al., Jour. Electrochem. Soc. (Jul. 1985), p. 1730.
Sedwick, Jour. Electrochem. Soc. 130 (1983), 484.

Primary Examiner—Upendra Roy
Attorney, Agent, or Firm—F. J. Baehr, Jr.

[57] ABSTRACT

The process of the invention includes applying precursors 6 with N- and P-type dopants therein to a silicon web 2, with the web 2 then being baked in an oven 10 to drive off excessive solvents, and the web 2 is then heated using a pulsed high intensity light in a mechanism 12 at 1100°–1150° C. for about 10 seconds to simultaneously form semiconductor junctions in both faces of the web.

1 Claim, 4 Drawing Figures

SEMICONDUCTOR JUNCTION FORMATION BY DIRECTED HEAT

GOVERNMENT CONTRACT

The Government has rights in this invention pursuant to Contract No. 956616MOD1 awarded by the U.S. Department of Energy.

BACKGROUND OF THE INVENTION

This invention pertains to the art of semiconductor junction formation.

Formation of semiconductor junctions in silicon webs, such as dendritic silicon webs for use as photovoltaic solar cells, for example, is typically carried out in a tube-type or belt-type diffusion furnace. If junctions are to be formed in both faces of the web, a two-step process is required in which a dopant layer is first diffused into one face, the face is then cleaned and masked as with silicon dioxide, $SiO_2$, to prevent cross-over of dopant from the diffused layer to the to-be-diffused layer at the opposite face and then, in a separate operation, another dopant layer is diffused into the opposite face. The heat-up to, say, 850°–950° C. and the subsequent cool-down for each separate layer may typically take 40 minutes or so.

It is the aim of this invention to provide a process for forming semiconductor junctions which is significantly faster, less complicated and less expensive and is particularly well adapted to forming junctions simultaneously in both faces of dendritic web silicon for solar cell applications. An important aspect of the invention is that the heat required to diffuse in the dopants is supplied by a relatively short duration pulse of high intensity light.

SUMMARY OF THE INVENTION

The method according to the invention for forming one or more semiconductor junctions in a silicon web of a given P- or N-type includes applying a liquid precursor containing a dopant of a desired P- or N-type to at least one face of the web, baking the web sufficiently to remove excess solvent, and then heating the web rapidly with a pulsed high intensity light for a period of less than a minute at temperatures in a range from about 950° C. to 1200° C.

BRIEF DESCRIPTION OF THE DRAWINGS

All of the Figures are largely schematic.

DESCRIPTION OF THE PREFERRED EMBODIMENT

The invention will be explained in connection with a silicon web which is to have a semiconductor junction in both of its opposite faces, but it is to be understood that the invention is also applicable to the formation of a single junction in one face of the web.

Figure 1:
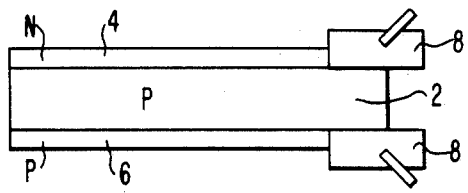
FIG. 1 is a simplified edge view of a web to which liquid precursors containing dopants is being applied to opposite faces of the web.

In FIG. 1, a predoped, P-type, dendritic silicon web 2 has a liquid precursor 4 containing an N-type dopant to one face of the web 2 and a liquid precursor 6 containing a P-type dopant is applied to the opposite face of the web 2. The liquid precursors may be applied in conventional fashion such as by using a foam brush 8, a meniscus coater or by a chemical vapor deposition method. Examples of the precursors which may be used are those which are commercially available, such as Allied Chemical Corp. P8 or Filmtronics, Inc. P2.5 for the precursor of the N-type, and Allied Chemical Corp. B150 for the P-type.

Figure 2:
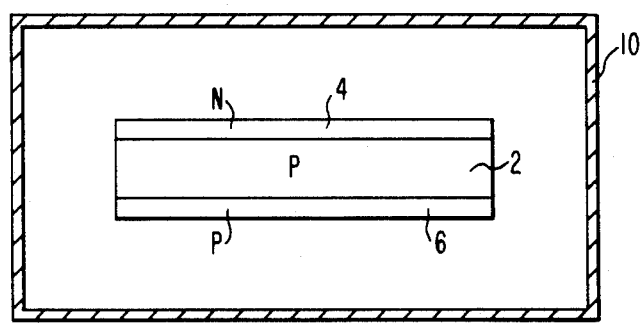
FIG. 2 is a simplified view of the web of FIG. 1 in an oven for baking.

The web 2 with the applied precursors 4 and 6 is then baked in an oven 10 (FIG. 2) to remove the excess solvent from the faces of the web. As an example of this step, the oven 10 may be an air environment oven which is heated to approximately 200° C. and the web is heated at that temperature for, say, 20 minutes or so to remove the excess solvent.

Figure 3:
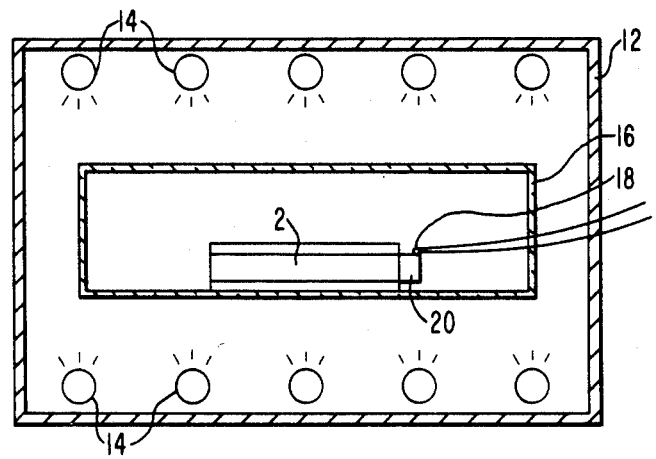
FIG. 3 is a simplified face view of the doped web located in a pulse high intensity light device for undergoing the rapid heating step.

The next step in the process is the rapid heating of the doped web by a pulsed high intensity light in a mechanism 12 as schematically shown in FIG. 3. The rapid thermal heater 12 of FIG. 3 is a tungsten halogen system such as is commercially available, for example, from A. G. Associates of Palo Alto, Calif. As publicly disclosed by this entity, the tungsten halogen system uses banks of tungsten halogen lamps 14 positioned above and below the web which, in the A. G. Associates' heat pulsed mechanism is placed in a quartz tube 16 for promoting thermal efficiency.

The web 2 is heated inside the mechanism 12 by pulsed high intensity light from the tungsten halogen lamps for a period of less than a minute at temperatures in a range from about 1000° C. to 1150° C. to simultaneously form junctions in both faces of the web. The preferred temperature and time for forming simultaneous junctions in both faces of the dendritic silicon web for use in solar cells is 950° C. to 1200° C. for about 5–15 seconds. This produces relatively shallow junctions which are preferable for solar cells. To obtain deeper junctions for other devices such as rectifiers and transistors, etc., the time and temperature may be increased proportionately.

For temperature measurement and control, a thermocouple 18 may be embedded in web material 20 thermally similar to the web 20, as suggested by A. G. Associates. It will be apparent that other temperature measurement and control system may also be used in carrying out the invention.

It is of the essence of the invention that the doping which takes place in the rapid thermal processing, occurs more quickly than a period of time which would permit cross-over of the dopant from one face of the web to the other face of the web and thereby permit contamination. As a result of the inventive process, only a single step is required in the doping so that the complicated and expensive two-step process of the conventional prior art is avoided, along with the cleaning and masking.

Figure 4:
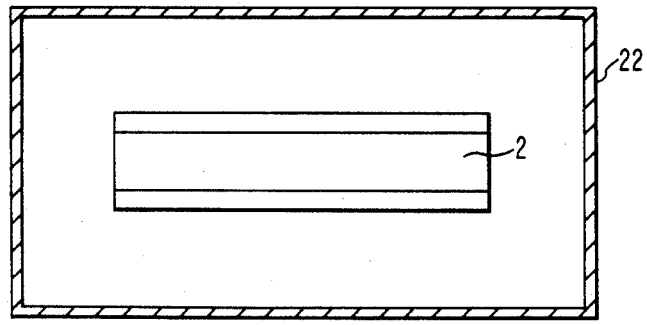
FIG. 4 is a simplified view of the web of FIG. 3 in an annealing oven.

In certain cases it may be desirable to anneal the web after the rapid heating process. The annealing is known to be able to take out defects in the web which are frozen in during too rapid cooling of the web. The annealing is done to provide for higher efficiencies for solar cells and to provide for higher carrier lifetimes for other semiconductors. The annealing may take place in an air environment oven 22 of FIG. 4 and in which the web 2 is heated in air at 750° C. to 850° C. for anywhere from 10 to 60 minutes.

I claim:

1. The method of forming semiconductor junctions in a dendritic silicon web of either P- or N-type, comprising:

applying a single coating of a liquid precursor solvent containing a dopant of a type opposite that of the web to one face of said web;

applying a single coating of a liquid precursor solvent containing a dopant of a type the same as that of the web to the opposite face of said web;

then baking the web in an oven at approximately 200° C. for approximately 20 minutes to remove excessive solvent;

then heating the web rapidly with a high intensity light for a period in the range of 15 seconds to attain temperatures in a range from about 950° C. to 1200° C. to simultaneously form junctions in both faces of said web; and then annealing said web in air following said rapid heating, at a temperature generally in the range of 750° C. to 850° C. for a period of 10 to 60 minutes to take out defects in the web frozen therein by the rapid cooling of the web when this high intensity light is shut off and thereby produce a highly efficient solar cell.

* * * * *